United States Patent
Han et al.

(10) Patent No.: US 6,663,920 B2
(45) Date of Patent: *Dec. 16, 2003

(54) ION IMPLANTATION METHOD FOR FABRICATING MAGNETORESISTIVE (MR) SENSOR ELEMENT

(75) Inventors: Cherng-Chyi Han, San Jose, CA (US); Rong-Fu Xiao, Fremont, CA (US); Mao-Min Chen, San Jose, CA (US); Po-Kang Wang, San Jose, CA (US)

(73) Assignee: Headway Technologies, Inc., Milpitas, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/100,130

(22) Filed: Mar. 18, 2002

(65) Prior Publication Data

US 2002/0094374 A1 Jul. 18, 2002

Related U.S. Application Data

(63) Continuation of application No. 09/360,118, filed on Jul. 23, 1999, now Pat. No. 6,383,574.

(51) Int. Cl.⁷ .............................. B05D 3/06; B05D 5/00; C23C 14/18; C23C 14/48; C23C 14/58
(52) U.S. Cl. ................... 427/526; 427/528; 427/531; 427/130; 427/131
(58) Field of Search ................... 427/130, 131, 427/528, 530, 531, 526

(56) References Cited

U.S. PATENT DOCUMENTS

| | | | |
|---|---|---|---|
| 3,792,452 A | * 2/1974 | Dixon et al. | 427/526 |
| 3,967,002 A | * 6/1976 | Almasi et al. | 427/526 |
| 4,520,040 A | * 5/1985 | Cordts | 427/531 |
| 4,751,100 A | * 6/1988 | Ogawa | 427/531 |
| 5,159,513 A | 10/1992 | Dieny et al. | 360/113 |
| 5,192,618 A | * 3/1993 | Frankel et al. | 427/130 |
| 5,543,183 A | * 8/1996 | Streckert et al. | 427/531 |
| 5,731,936 A | 3/1998 | Lee et al. | 360/113 |
| 5,739,990 A | 4/1998 | Ravipati et al. | 360/113 |
| 5,843,589 A | 12/1998 | Hoshiya et al. | 428/692 |
| 6,074,767 A | * 6/2000 | Lin | 427/130 |
| 6,086,727 A | * 7/2000 | Pinarbasi | 247/131 |
| 6,093,444 A | * 7/2000 | Miyauchi et al. | 427/130 |
| 6,277,505 B1 | * 8/2001 | Shi et al. | 427/131 |

FOREIGN PATENT DOCUMENTS

JP 359063707 A * 4/1984

OTHER PUBLICATIONS

Translation of JP 359063707A by Hiroshi et al cited in paper #3, 4/84.*

* cited by examiner

*Primary Examiner*—Marianne Padgett
(74) *Attorney, Agent, or Firm*—George O. Saile; Stephen B. Ackerman (57) ABSTRACT

A method for forming a magnetoresistive (MR) layer first employs a substrate over which is formed a magnetoresistive (MR) layer formed of a magnetoresistive (MR) material. There is then ion implanted selectively, while employing an ion implant method, the magnetoresistive (MR) layer to form: (1) an ion implanted portion of the magnetoresistive (MR) layer formed of an ion implanted magnetoresistive (MR) material; and (2) an adjoining non ion implanted portion of the magnetoresistive (MR) layer formed of the magnetoresistive (MR) material, where the ion implanted magnetoresistive (MR) material is a non magnetoresistive (MR) material. The method may be employed for forming within magnetoresistive (MR) sensor elements magnetoresistive (MR) layers with enhanced dimensional uniformity, and in particular enhanced overlay dimensional uniformity.

12 Claims, 3 Drawing Sheets

ION IMPLANTATION METHOD FOR FABRICATING MAGNETORESISTIVE (MR) SENSOR ELEMENT

This is a continuation of patent application Ser. No. 09/360,118, filing date Jul. 23, 1999, now U.S. Pat. No. 6,383,574, issued May 7, 2002 Ion Implantation Method For Fabricating Magnetoresistive (Mr) Sensor Element, assigned to the same assignee as the present invention.

BACKGROUND OF THE INVENTION

1. Field of the Invention

The present invention relates generally to magnetoresistive (MR) sensor elements employed within magnetic data storage and retrieval. More particularly, the present invention relates to methods for forming with enhanced dimensional uniformity magnetoresistive (MR) layers employed within magnetoresistive (MR) sensor elements employed within magnetic data storage and retrieval.

2. Description of the Related Art

The recent and continuing advances in computer and information technology have been made possible not only by the correlating advances in the functionality, reliability and speed of semiconductor integrated circuits, but also by the correlating advances in the storage density and reliability of direct access storage devices (DASDs) employed in digitally encoded magnetic data storage and retrieval.

Storage density of direct access storage devices (DASDs) is typically determined as areal storage density of a magnetic data storage medium formed upon a rotating magnetic data storage disk within a direct access storage device (DASD) magnetic data storage enclosure. The areal storage density of the magnetic data storage medium is defined largely by the track width, the track spacing and the linear magnetic domain density within the magnetic data storage medium. The track width, the track spacing and the linear magnetic domain density within the magnetic data storage medium are in turn determined by several principal factors, including but not limited to: (1) the magnetic read-write characteristics of a magnetic read-write head employed in reading and writing digitally encoded magnetic data from and into the magnetic data storage medium; (2) the magnetic domain characteristics of the magnetic data storage medium; and (3) the separation distance of the magnetic read-write head from the magnetic data storage medium.

With regard to the magnetic read-write characteristics of magnetic read-write heads employed in reading and writing digitally encoded magnetic data from and into a magnetic data storage medium, it is known in the art of magnetic read-write head fabrication that magnetoresistive (MR) sensor elements employed within magnetoresistive (MR) read-write heads are generally superior to other types of magnetic sensor elements when employed in retrieving digitally encoded magnetic data from a magnetic data storage medium. In that regard, magnetoresistive (MR) sensor elements are generally regarded as superior since magnetoresistive (MR) sensor elements are known in the art to provide high output digital read signal amplitudes, with good linear resolution, independent of a relative velocity of a magnetic data storage medium with respect to a magnetoresistive (MR) read-write head having the magnetoresistive (MR) sensor element incorporated therein.

While magnetoresistive (MR) sensor elements are thus desirable within the art of magnetic data storage and retrieval, magnetoresistive (MR) sensor elements are nonetheless not fabricated entirely without problems within the art of magnetoresistive (MR) sensor element fabrication. In particular, it is often difficult to fabricate within a magnetoresistive (MR) sensor element magnetic layers, such as but not limited to magnetoresistive (MR) layers, with enhanced dimensional uniformity, such enhanced dimensional uniformity including but not limited to enhanced dimensional overlay uniformity.

It is thus towards the goal of providing for use within magnetoresistive (MR) sensor element fabrication methods for forming with enhanced dimensional uniformity magnetic layers, such as magnetoresistive (MR) layers, within those magnetoresistive (MR) sensor elements, that the present invention is directed.

Various magnetoresistive (MR) sensor elements having desirable properties, as well as higher level magnetic data storage enclosure fabrications fabricated incorporating those magnetoresistive (MR) sensor elements having the desirable properties, have been disclosed in the art of magnetoresistive (MR) sensor element fabrication.

For example, Dieny et al., in U.S. Pat. No. 5,159,513, disclose a magnetoresistive (MR) sensor element which provides a desirably enhanced magnetoresistive (MR) response when detecting magnetic data encoded at a diminished magnetic data encoding field strength. The magnetoresistive (MR) sensor element is a spin valve magnetoresistive (SVMR) sensor element wherein at least one of a pair of ferromagnetic layers within the spin valve magnetoresistive (SVMR) sensor element is formed of either cobalt or a cobalt alloy.

In addition, Lee et al., in U.S. Pat. No. 5,731,936, disclose a magnetoresistive (MR) sensor element which exhibits an enhanced magnetoresistive (MR) coefficient (i.e. an enhanced magnetoresistive (MR) resistivity sensitivity), as well as an improved thermal stability. To effect the foregoing results, the magnetoresistive (MR) sensor element employs one or more chromium based spacer layers interfacially adjacent a nickel-iron permalloy alloy magnetoresistive (MR) layer within the magnetoresistive (MR) sensor element.

Further, Ravipati et al., in U.S. Pat. No. 5,739,990, disclose a magnetoresistive (MR) sensor element having an improved electrical bias, as well as a low resistivity. The magnetoresistive (MR) sensor element, which may be an anisotropic magnetoresistive (AMR) sensor element or a spin valve magnetoresistive (SVMR) sensor element, employs: (1) a pair of patterned conductor lead layers formed abutting at least one magnetoresistive (MR) layer within the magnetoresistive (MR) sensor element, in conjunction with; (2) a pair of patterned longitudinal magnetic bias layers which are formed in contact with the pair of patterned conductor lead layers but overlapping the at least one patterned magnetoresistive (MR) layer to define a trackwidth of the magnetoresistive (MR) sensor element.

Finally, Hoshiya et al., in U.S. Pat. No. 5,843,589, discloses a magnetic material laminate and a magnetoresistive (MR) sensor element fabricated employing the magnetic material laminate, wherein the magnetoresistive (MR) sensor element provides an enhanced signal amplitude and an enhanced signal-to-noise ratio, with enhanced reliability. To realize the foregoing objects, the magnetoresistive (MR) sensor element employs as the magnetic material laminate a cobalt or a cobalt alloy ferromagnetic magnetoresistive (MR) material layer formed in contact with a chromium-manganese alloy anti-ferromagnetic magnetic biasing layer within the magnetoresistive (MR) sensor element.

Desirable in the art of magnetoresistive (MR) sensor element fabrication are additional methods and materials which may be employed to form within the art of magnetoresistive (MR) sensor element fabrication magnetic layers, such as magnetoresistive (MR) layers, with enhanced dimensional uniformity.

It is toward the foregoing object that the present invention is directed.

SUMMARY OF THE INVENTION

A first object of the present invention is to provide a method for fabricating a magnetoresistive (MR) sensor element.

A second object of the present invention is to provide a method in accord with the first object of the present invention, wherein a magnetic layer within the magnetoresistive (MR) sensor element is fabricated with enhanced dimensional uniformity.

A third object of the present invention is to provide a method in accord with the first object of the present invention and the second object of the present invention, which method is readily commercially implemented.

In accord with the present invention, there is provided by the present invention a method for forming a magnetic layer. To practice the method of the present invention, there is first provided a substrate. There is then formed over the substrate a magnetic layer formed of a magnetic material, where the magnetic material has a first value of a magnetic characteristic of the magnetic material. There is then ion implanted, while employing an ion implant method, at least a portion of the magnetic layer to form at least an ion implanted portion of the magnetic layer, where the at least the ion implanted portion of the magnetic layer is formed of an ion implanted magnetic material, and where the ion implanted magnetic material has a second value of the magnetic characteristic of the magnetic material different from the first value of the magnetic characteristic of the magnetic material.

The present invention provides a method for fabricating a magnetoresistive (MR) sensor element, wherein a magnetic layer within the magnetoresistive (MR) sensor element is fabricated with enhanced dimensional uniformity. The method of the present invention realizes the foregoing object by employing when fabricating the magnetic layer an ion implant method which provides a second value of a magnetic characteristic of an ion implanted magnetic material from which is formed an ion implanted magnetic layer different in comparison with a first value of a magnetic characteristic of a magnetic material from which is formed a magnetic layer from which in turn is formed via the ion implant method the ion implanted magnetic layer (i.e. a magnetic characteristic of a magnetic layer is changed by ion implanting the magnetic layer). Since the ion implant method may be undertaken as a masked ion implant method with controlled ion implant dimensional bias with respect to an ion implant mask layer employed within the ion implant method, there may be fabricated while employing the present invention a magnetic layer within a magnetoresistive (MR) sensor element with enhanced dimensional uniformity.

The method of the present invention is readily commercially implemented. The present invention employs methods and materials, which although not necessarily previously employed within the art of magnetoresistive (MR) sensor element fabrication, are, as illustrated within the Description of the Preferred Embodiment which follows, readily adapted to the art of magnetoresistive (MR) sensor element fabrication. Since the present invention is directed towards the adaptation of methods at least generally known within other arts, rather than developing entirely new methods and materials, the method of the present invention is comparatively readily commercially implemented.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENTS

The present invention provides a method for fabricating a magnetoresistive (MR) sensor element, wherein a magnetic layer within the magnetoresistive (MR) sensor element is fabricated with enhanced dimensional uniformity. The method of the present invention realizes the foregoing object by employing when fabricating the magnetic layer an ion implant method which provides a second value of a magnetic characteristic of an ion implanted magnetic material from which is formed an ion implanted magnetic layer different in comparison with a first value of the magnetic characteristic of a magnetic material from which is formed a magnetic layer from which in turn is formed via the ion implant method the ion implanted magnetic layer (i.e. a magnetic characteristic of a magnetic layer is changed by ion implanting the magnetic layer). Since the ion implant method may be undertaken as a masked ion implant method with controlled ion implant dimensional bias with respect to an ion implant mask layer employed within the ion implant method, there may be fabricated while employing the present invention a magnetic layer within a magnetoresistive (MR) sensor element with enhanced dimensional uniformity.

While the preferred embodiment of the present invention illustrates the present invention within the context of forming a spin valve magnetoresistive (SVMR) sensor element generally for use within digitally encoded magnetic data storage and retrieval, with enhanced dimensional overlay uniformity of a pair of magnetoresistive (MR) ferromagnetic layers within the spin valve magnetoresistive (MR) sensor element, the method of the present invention may be employed for forming with enhanced dimensional uniformity magnetic layers for use within magnetoresistive (MR) sensor elements including but not limited to single stripe magnetoresistive (MR) sensor elements, dual stripe magnetoresistive (DSMR) sensor elements, spin valve magnetoresistive (SVMR) sensor elements and dual spin valve magnetoresistive (DSVMR) sensor elements within magnetic data storage and retrieval applications including but not limited to analog magnetic data and storage and retrieval applications and digital magnetic data storage and retrieval applications employing magnetic data storage enclosures including but not limited to linear access storage device (LASD) magnetic data storage enclosures and direct access storage device (DASD) magnetic data storage enclosures.

In its most general sense, the present invention is directed towards an ion implant method for modifying a magnetic characteristic of a magnetic material employed within a magnetic layer. Similarly, while the preferred embodiment of the present invention illustrates the present invention within the context of modifying a magnetoresistive (MR) magnetic characteristic of a magnetoresistive (MR) ferromagnetic magnetic layer while employing an ion implant method, in accord with the examples which follow, and without expectation of undue experimentation, it is also expected that the present invention may also be employed to modify other magnetic characteristics of other magnetic layers while in general employing the method of the present invention. In that regard, it is expected that the method of the present invention may be employed for modifying magnetic characteristics within corresponding magnetic layers including but not limited to ferromagnetic characteristics within ferromagnetic layers, antiferromagnetic characteristics within antiferromagnetic layers and magnetoresistive (MR) characteristics within magnetoresistive (MR) layers employed within any of the foregoing magnetoresistive (MR) sensor elements. Similarly, the method of the present invention may be employed to enhance or degrade magnetic characteristics when modifying magnetic materials within magnetic layers.

Figure 1:
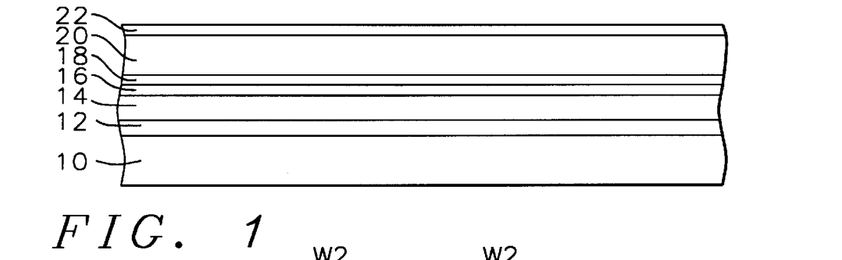
FIG. 1, FIG. 2, FIG. 3, FIG. 4 and FIG. 5 show a series of schematic air bearing surface (ABS) view diagrams illustrating the results of progressive stages in forming in accord with a preferred embodiment of the present invention a spin valve magnetoresistive (SVMR) sensor element.

Referring now to FIG. 1 to FIG. 5, there is shown a series of schematic air bearing surface (ABS) view diagrams illustrating the results of forming, in accord with a preferred embodiment of the present invention, a spin valve magnetoresistive (SVMR) sensor element. Shown in FIG. 1 is a schematic air bearing surface view diagram of the spin valve magnetoresistive (SVMR) sensor element at an early stage in its fabrication in accord with the present invention.

Shown in FIG. 1 is a substrate 10, having formed thereover a series of six layers. The series of six layers includes: (1) a seed layer 12 formed upon the substrate 10; (2) a magnetoresistive (MR) ferromagnetic free layer 14 formed upon the seed layer 12; (3) a non magnetic conductor spacer layer 16 formed upon the magnetoresistive (MR) ferromagnetic free layer 14; (4) a magnetoresistive (MR) ferromagnetic pinned layer 18 formed upon the non magnetic conductor spacer layer 16; (5) a magnetic pinning layer 20 formed upon the magnetoresistive (MR) ferromagnetic pinned layer 18; and (6) a cap layer 22 formed upon the magnetic pinning layer 20. Within the preferred embodiment of the present invention, each of the foregoing substrate 10 and the corresponding six layers formed thereover may be formed employing methods and materials as are conventional in the art of magnetoresistive (MR) sensor element fabrication.

For example, although it is known in the art of magnetoresistive (MR) sensor element fabrication that substrates may be formed of non-magnetic ceramic materials such as but not limited to nitrides, oxides, carbides and borides, as well as homogeneous and heterogeneous mixtures of nitrides, oxides, carbides and borides, for the preferred embodiment of the present invention, the substrate 10 is typically and preferably comprises a base substrate formed of a non-magnetic alumina-titanium carbide ceramic material. Typically and preferably, the substrate 10 is formed of dimensions sufficient such that the substrate 10 may be fabricated into a slider employed within a direct access storage device (DASD) employed within digitally encoded magnetic data storage and retrieval, although, as noted above, magnetoresistive (MR) sensor elements fabricated in accord with the present invention may be employed within magnetic data storage and transduction applications including but not limited to analog magnetic data storage and transduction applications and digital magnetic data storage and transduction applications while employing magnetic data storage enclosures including but not limited to linear access storage device (LASD) magnetic data storage enclosures and direct access storage device (DASD) magnetic data storage enclosures.

Although not specifically illustrated within the schematic air bearing surface (ABS) view diagram of FIG. 1, as is understood by a person skilled in the art, typically and preferably the substrate 10 also comprises, in addition to the base substrate formed of the alumina-titanium carbide ceramic material any of several additional layers formed thereupon and/or thereover as are conventional when fabricating a spin valve magnetoresistive (SVMR) sensor element prior to forming over the base substrate the six layers as are illustrated within the schematic air bearing surface (ABS) view diagram of FIG. 1. Such additional layers may include, but are not limited to shield layers, undercoating layers and additional spacer layers. Within the preferred embodiment of the present invention, it is intended that the substrate 10 comprises the base substrate having formed thereupon and or thereover, and thus incorporated therein, such additional layers. Typically and preferably, the upper surface of the substrate 10 is formed of a non-magnetic spacer material which separates the seed layer 12 from a shield layer which also comprises the substrate 10.

Within the preferred embodiment of the present invention with respect to the seed layer 12, the seed layer 12 is typically and preferably formed of a seed material which facilitates forming the spin valve magnetoresistive (SVMR) sensor element whose schematic air bearing surface (ABS) view diagram is illustrated in FIG. 1 with an enhanced magnetoresistive (MR) resistivity sensitivity. Such seed materials are disclosed in greater detail within a related coassigned U.S. patent application Ser. No. 09/236,488, filed Jan. 25, 1999, titled "Giant Magnetoresistive (GMR) Sensor Element With Enhanced Magnetoresistive (MR) Resistivity Sensitivity," the teachings of which are incorporated herein fully by reference. More particularly, in accord with the related co-assigned U.S. patent application Ser. No. 09/236,488, the seed layer 12 is typically and preferably formed of a nickel-chromium alloy seed material of atomic ratio from about 80:20 to about 50:50 (more preferably about 60:40) or a nickel-iron-chromium alloy seed material of atomic ratio from about 64:16:20 to about 40:10:50) more preferably about 48:12:40), when at least a portion of the magnetoresistive (MR) ferromagnetic free layer 14 in contact therewith is formed of a nickel-iron (80:20; w/w) permalloy magnetoresistive (MR) ferromagnetic material. Typically and preferably, the seed layer 12 is formed to a thickness of from about 20 to about 100 angstroms.

Within the preferred embodiment of the present invention with respect to the magnetoresistive (MR) ferromagnetic free layer 14 and the magnetoresistive (MR) ferromagnetic pinned layer 18, both the magnetoresistive (MR) ferromagnetic free layer 14 and the magnetoresistive (MR) ferromagnetic pinned layer 18 may be formed of magnetoresistive (MR) ferromagnetic materials as are known in the art of magnetoresistive (MR) sensor element fabrication, including but not limited to nickel-iron (80:20; w/w) permalloy alloy magnetoresistive (MR) ferromagnetic materials, higher order alloys incorporating nickel-iron permalloy alloy magnetoresistive (MR) ferromagnetic materials, other nickel magnetoresistive (MR) ferromagnetic materials, other iron magnetoresistive (MR) ferromagnetic materials and cobalt magnetoresistive (MR) ferromagnetic materials, as well as additional alloys thereof and laminates thereof. Typically and preferably, the magnetoresistive (MR) ferromagnetic free layer 14 is formed to a thickness of from about 20 to about 100 angstroms, while the magnetoresistive (MR) ferromagnetic pinned layer 18 is formed to a thickness of from about 10 to about 50 angstroms, where each is typically and preferably formed, at least in part, of a nickel-iron permalloy alloy magnetoresistive (MR) ferromagnetic material.

Within the preferred embodiment of the present invention with respect to the non magnetic conductor spacer layer 16, as is understood by a person skilled in the art, the non magnetic conductor spacer layer 16 may be formed of a non magnetic conductor material selected from the group including but not limited to copper, copper alloy, silver, silver alloy, gold and gold alloy non magnetic conductor materials. Typically and preferably, the non magnetic conductor spacer layer 16 is formed to a thickness of from about 10 to about 50 angstroms.

Within the preferred embodiment of the present invention with respect to the magnetic pinning layer 20, although it is known in the art of magnetoresistive (MR) sensor element fabrication that magnetic pinning layers may be formed of hard magnetic pinning materials including but not limited to permanent magnet hard magnetic pinning materials (such as but not limited to platinum-cobalt alloy hard magnetic pinning materials and higher order alloys incorporating platinum-cobalt alloy hard magnetic pinning materials, such as but not limited to platinum-cobalt-chromium alloy hard magnetic pinning materials) and antiferromagnetic hard magnetic pinning materials (such as but not limited to iron-manganese alloy antiferromagnetic pinning materials, nickel-manganese alloy antiferromagnetic pinning materials, iridium-manganese alloy antiferromagnetic pinning materials, platinum-manganese alloy antiferromagnetic pinning materials and higher order antiferromagnetic alloys thereof), for the preferred embodiment of the present invention, the magnetic pinning layer 20 is preferably formed of a platinum-manganese (50:50; w/w) alloy antiferromagnetic hard magnetic pinning material. Typically and preferably, the magnetic pinning layer 20 is formed to a thickness of from about 30 to about 300 angstroms.

Finally, within the preferred embodiment of the present invention with respect to the cap layer 22, although the cap layer 22 may be formed from any of several cap materials as are conventional in the art of magnetoresistive (MR) sensor element fabrication, including but not limited to nominally inert and impervious conductor cap materials such as but not limited to tantalum cap materials and tungsten cap materials, for the preferred embodiment of the present invention, the cap layer 22 is typically and preferably formed of a tantalum cap material. Typically and preferably, the cap layer 22 is formed to a thickness of from about 30 to about 100 angstroms.

Although not specifically illustrated within the schematic air bearing surface (ABS) view diagram of FIG. 1, and as is similarly understood by a person skilled in the art, although there is illustrated within FIG. 1 the six layers formed over the substrate 10 as blanket layers, any one, or several, of the six layers may alternatively and preferably be formed as patterned layers as are conventional in the art of magnetoresistive (MR) sensor element fabrication.

Figure 2:
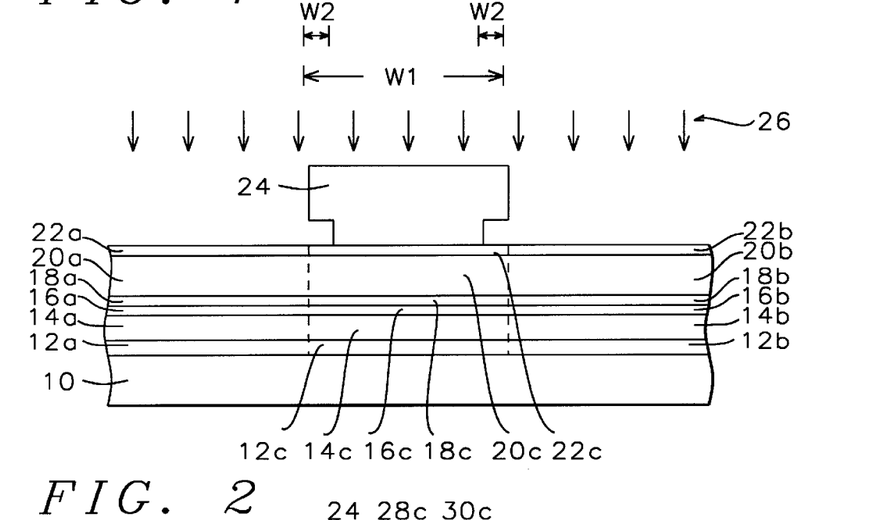

Referring now to FIG. 2, there is shown a schematic air bearing surface (ABS) view diagram illustrating the results of further processing of the spin-valve magnetoresistive (SVMR) sensor element whose schematic air bearing surface (ABS) view diagram is illustrated in FIG. 1.

Shown in FIG. 2 is a schematic air bearing surface (ABS) view diagram of a spin valve magnetoresistive (SVMR) sensor element otherwise equivalent to the spin valve magnetoresistive (SVMR) sensor element whose schematic air bearing surface (ABS) view diagram is illustrated in FIG. 1, but wherein, in a first instance, there is formed upon the cap layer 22 a lift off stencil 24. Within the preferred embodiment of the present invention, the lift off stencil 24 may be formed employing methods and materials as are conventional in the art of magnetoresistive (MR) sensor element fabrication, which methods and materials will typically at least in part include photolithographic methods and materials. For the preferred embodiment of the present invention, the lift off stencil 24 is preferably formed employing a patterned photoresist layer which symmetrically overhangs a patterned soluble underlayer. As is illustrated within the schematic air bearing surface (ABS) view of FIG. 2, the patterned photoresist layer will typically and preferably have a linewidth W1 of from about 0.2 to about 1.0 microns while symmetrically overhanging the patterned soluble underlayer by an overhang width W2 of from about 0.05 to about 0.3 microns. Typically and preferably, the aggregate of the patterned photoresist layer and the patterned soluble underlayer is formed to a thickness of from about 3000 to about 8000 angstroms.

Also shown within the schematic air bearing surface (ABS) view diagram of FIG. 2 is the results of employing the lift off stencil 24 as an ion implantation mask with respect to a dose of implanting ions 26 which sequentially form: (1) from the cap layer 22 a pair of ion implanted portions of the cap layer 22a and 22b laterally abutting a non ion implanted portion of the cap layer 22c; (2) from the magnetic pinning layer 20 a pair of ion implanted portions of the magnetic pinning layer 20a and 20b laterally abutting a non ion implanted portion of the magnetic pinning layer 20c; (3) from the magnetoresistive (MR) ferromagnetic pinned layer 18 a pair of ion implanted portions of the magnetoresistive (MR) ferromagnetic pinned layer 18a and 18b laterally abutting a non ion implanted portion of the magnetoresistive (MR) ferromagnetic pinned layer 18c; (4) from the non magnetic conductor spacer layer 16 a pair of ion implanted portions of the non magnetic conductor spacer layer 16a and 16b laterally abutting a non ion implanted portion of the non magnetic conductor spacer layer 16c; (5) from the magnetoresistive (MR) ferromagnetic free layer 14 a pair of ion implanted portions of the magnetoresistive (MR) ferromagnetic free layer 14a and 14b laterally abutting a non ion implanted portion of the magnetoresistive (MR) ferromagnetic free layer 14c; and (6) from the seed layer 12 a pair of ion implanted portions of the seed layer 12a and 12b laterally abutting a non ion implanted portion of the seed layer 12c.

Within the preferred embodiment of the present invention, incident to ion implanting at a sufficient ion implantation dose and a sufficient ion implantation range, the ion implanted portions of the magnetoresistive (MR) ferromagnetic free layer 14a and 14b, as well as the ion implanted portion of the magnetoresistive (MR) ferromagnetic pinned layer 18a and 18b, the magnetoresistive (MR) ferromagnetic material which is ion implanted when forming the foregoing ion implanted portions is transformed from a magnetoresistive (MR) ferromagnetic materials into a non magnetoresistive (MR) non-ferromagnetic material.

For example and without limitation, when the magnetoresistive (MR) ferromagnetic pinned layer 18 and the magnetoresistive (MR) ferromagnetic free layer 14 are both formed at least in part of a nickel-iron (80:20 w/w) permalloy magnetoresistive (MR) ferromagnetic material, in order to effect the transformation of the nickel-iron (80:20; w/w) magnetoresistive (MR) ferromagnetic material into a non magnetoresistive (MR) non ferromagnetic material within the ion implanted portions of the magnetoresistive (MR) ferromagnetic pinned layer 18a and 18b and the ion implanted portions of the magnetoresistive (MR) ferromagnetic free layer 14a and 14b, there may be employed a dose of chromium implanting ions 26 at an ion implant dose of from about 9E16 to about 1.1E17 chromium implanting ions per square centimeter and an ion implantation energy of about 100 keV. The dose of chromium implanting ions 26 is selected to provide an atomic percent of chromium within the ion implanted portions of the magnetoresistive (MR) ferromagnetic pinned layer 18a and 18b and the ion implanted portions of the magnetoresistive (MR) ferromagnetic free layer 14a and 14b of from about 30 to about 50 percent. Similarly, there may also be employed within the context of the preferred embodiment of the present invention implanting ions 26 other than chromium implanting ions 26, where such other implanting ions may include, but are not limited to ions of non-magnetic materials such as but not limited to titanium, tantalum and molybdenum. As is understood by a person skilled in the art, and within the context of the examples which follow, additional combinations of magnetoresistive (MR) ferromagnetic materials and appropriate implanting ions may be readily determined without undue experimentation. Similarly, as noted above, it is also expected that there may be determined in accord with the present invention additional combinations of implanting ion with magnetic layers other than magnetoresistive (MR) ferromagnetic layers to provide a modified magnetic characteristic of those other magnetic layers.

Figure 3:
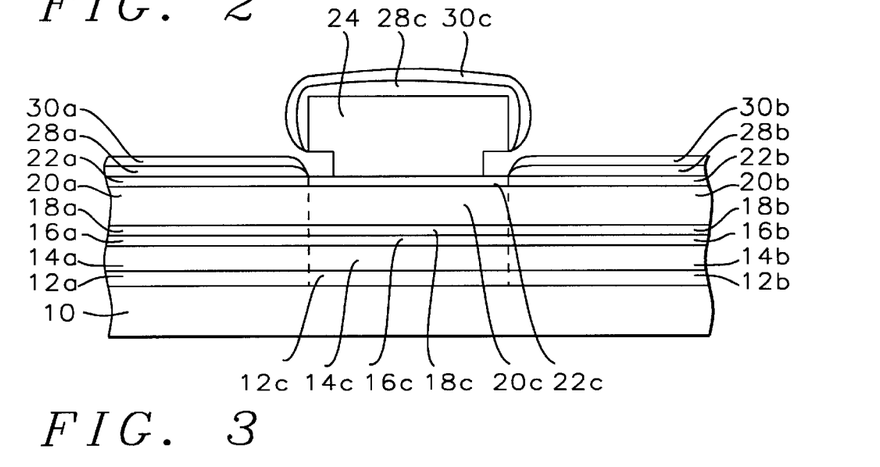

Referring now to FIG. 3, there is shown a schematic air bearing surface (ABS) view diagram illustrating the results of further processing of the spin valve magnetoresistive (SVMR) sensor element whose schematic air bearing surface (ABS) view diagram is illustrated in FIG. 2.

Shown in FIG. 3 is a schematic air bearing surface (ABS) view diagram of a spin valve magnetoresistive (SVMR) sensor element otherwise equivalent to the spin valve magnetoresistive (SVMR) sensor element whose schematic air bearing surface (ABS) view diagram is illustrated in FIG. 2, but wherein there is formed substantially upon the pair of ion implanted portions of the cap layer 22a and 22b a corresponding pair of patterned permanent magnet magnetic bias layers 28a and 28b which in turn have formed and aligned thereupon a pair of patterned conductor lead layers 30a and 30b. Similarly, there is also shown within the schematic air bearing surface view diagram of FIG. 3 formed upon the lift off stencil a permanent magnet magnetic bias layer residue 28c having formed thereupon a conductor lead layer residue 30c.

Within the preferred embodiment of the present invention, the pair of patterned permanent magnet magnetic bias layers 28a and 28b, and the permanent magnet magnetic bias layer residue 28c, may be formed of permanent magnet magnetic materials as are conventional in the art of magnetoresistive (MR) sensor element fabrication, similarly to the permanent magnet hard magnet magnetic bias materials as are disclosed above for use when forming the magnetic pinning layer 20. Typically and preferably, the pair of patterned permanent magnet magnetic bias layers 28a and 28b, and the permanent magnet magnetic bias layer residue 28c, is formed to a thickness of from about 100 to about 1000 angstroms from a cobalt-platinum (80:20: w/w) permanent magnet magnetic material.

Within the preferred embodiment of the present invention with respect to the pair of patterned conductor lead layers 30a and 30b and the conductor lead layer residue 30c, the pair of patterned conductor lead layers 30a and 30b and the conductor lead layer residue 30c may be formed of conductor lead materials as are conventional in the art of magnetoresistive (MR) sensor element fabrication, including but not limited to gold, gold alloy, copper, copper alloy, silver, silver alloy, tungsten, tungsten alloy, tantalum and tantalum alloy conductor lead materials, as well as laminates thereof. Typically and preferably, each of the patterned conductor lead layers 30a and 30b, as well as the conductor lead layer residue 30c, is formed to a thickness of from about 100 to about 1000 angstroms.

Figure 4:
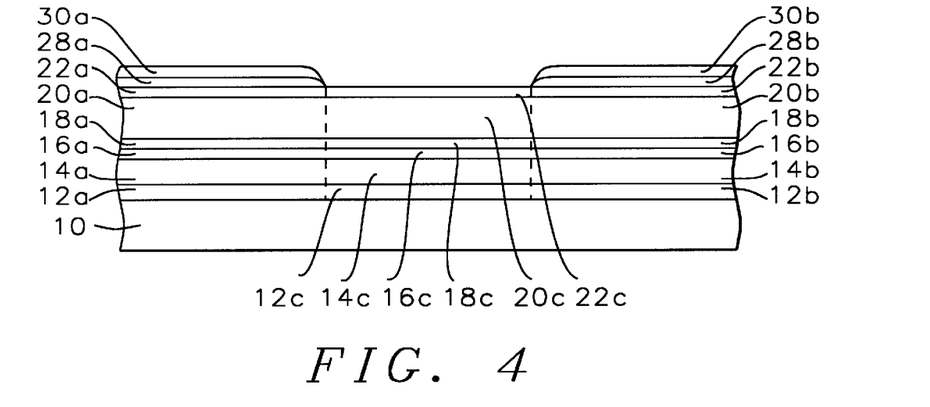

Referring now to FIG. 4, there is shown a schematic air bearing surface (ABS) view diagram illustrating the results of further processing of the spin valve magnetoresistive (SVMR) sensor element whose schematic air bearing surface (ABS) view diagram is illustrated in FIG. 3, Shown in FIG. 4 is a schematic air bearing surface (ABS) view diagram of a spin valve magnetoresistive (SVMR) sensor element otherwise equivalent to the spin valve magnetoresistive (SVMR) sensor element whose schematic air bearing surface (ABS) view diagram is illustrated in FIG. 3, but wherein there is stripped from the spin valve magnetoresistive (SVMR) sensor element the lift off stencil 24, while taking with it the permanent magnet magnetic bias layer residue 28c and the conductor lead layer residue 30c.

The spin valve magnetoresistive (SVMR) sensor whose schematic air bearing surface (ABS) view diagram is illustrated in FIG. 4 may be formed from the spin valve magnetoresistive (SVMR) sensor element whose schematic air bearing surface (ABS) view diagram is illustrated in FIG. 3 while employing stripping methods as are conventional in the art of magnetoresistive (MR) sensor element fabrication, typically and preferably including, but not limited to, wet chemical stripping methods.

Figure 5:
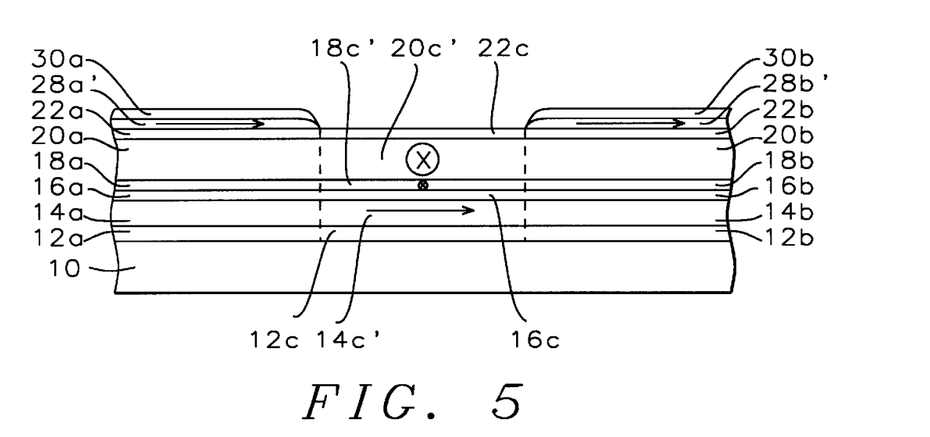

Referring now to FIG. 5, there is shown a schematic air bearing surface (ABS) view diagram illustrating the results of further processing of the spin valve magnetoresistive (SVMR) sensor element whose schematic air bearing surface (ABS) view diagram is illustrated in FIG. 4.

Shown in FIG. 5, is a schematic air bearing surface (ABS) view diagram of a spin valve magnetoresistive (SVMR) sensor element otherwise equivalent to the spin valve magnetoresistive (SVMR) sensor element whose schematic air bearing surface (ABS) view diagram is illustrated in FIG. 4, but wherein: (1) at least the non ion implanted portion of the magnetic pinning layer 20c (and typically presumably the ion implanted portions also) has been biased in a first magnetic bias direction to form a magnetically biased non ion implanted portion of the magnetic pinning layer 20c' while simultaneously biasing the non ion implanted portion of the magnetoresistive (MR) ferromagnetic pinned layer 18c to form a corresponding magnetically biased non ion implanted portion of the magnetoresistive (MR) ferromagnetic pinned layer 18c', while; (2) the patterned permanent magnet magnetic bias layers 28a and 28b have been biased in a second magnetic bias direction perpendicular the first magnetic bias direction to form a corresponding pair of magnetically biased patterned permanent magnetic bias layers 28a' and 28b' while simultaneously magnetically biasing the non ion implanted portion of the magnetoresistive (MR) ferromagnetic free layer 14c to form a corresponding magnetically biased non ion implanted portion of the magnetoresistive (MR) ferromagnetic free layer 14c'.

To fabricate the spin valve magnetoresistive (SVMR) sensor element whose schematic air bearing surface (ABS)

view diagram is illustrated in FIG. 5 from the spin valve magnetoresistive (SVMR) sensor element whose air bearing surface (ABS) view diagram is illustrated in FIG. 4, there is typically and preferably employed a two step thermal annealing method employing two separate temperatures which exploit a difference in magnetic coercivities and/or blocking temperatures of the materials from which are formed the magnetic pinning layer 20 and the patterned permanent magnet magnetic biasing layers 28a and 28b.

Within the preferred embodiment of the present invention under conditions where a platinum-manganese (50:50; w/w) antiferromagnetic hard magnetic material is employed for forming the magnetic pinning layer 20 and a cobalt-platinum (80:20; w/w) permanent magnet magnetic material is employed for forming the pair of patterned permanent magnet magnetic bias layers 28a and 28b, there is typically and preferably employed within the two step thermal annealing method: (1) a first thermal annealing temperature of about 250 to about 300 degrees centigrade, a first thermal annealing exposure time of from about 2 to about 5 hours and a first extrinsic magnetic bias field strength of about 1000 to about 5000 oersteds primarily for magnetically biasing the patterned permanent magnet magnetic bias layers 28a and 28b when forming the magnetically biased patterned permanent magnet magnetic bias layers 28a' and 28b', followed by; (2) a second thermal annealing method employing a second thermal annealing temperature of from about 150 to about 200 degrees centigrade, a second thermal annealing exposure time of from about 0.5 to about 1 hour and a second extrinsic magnetic bias field of from about 200 to about 500 oersteds in a second magnetic bias field direction perpendicular to a first magnetic bias field direction primarily for realigning the non ion implanted portion of the magnetic pinning layer 20c to form the magnetically biased non ion implanted portion of the pinning layer 20c' which simultaneously aligns therewith the magnetically biased non ion implanted portion of the magnetoresistive (MR) ferromagnetic pinned layer 18c'.

Upon forming the spin valve magnetoresistive (SVMR) sensor element whose schematic air bearing surface (ABS) view diagram is illustrated within FIG. 5, there is formed a spin valve magnetoresistive (SVMR) sensor element with enhanced magnetoresistive (MR) layer dimensional uniformity, including enhanced magnetoresistive (MR) layer dimensional overlay uniformity. The spin-valve magnetoresistive (SVMR) sensor element realizes the foregoing object by employing when forming a pair of magnetoresistive (MR) ferromagnetic layers within the spin valve magnetoresistive (SVMR) sensor element a selective ion implant method wherein each of a pair of magnetoresistive (MR) ferromagnetic layers is selective ion implanted to form a corresponding pair of ion implanted ferromagnetic magnetoresistive (MR) layers, each pair of which is abutting a non ion implanted magnetoresistive (MR) ferromagnetic layer, where upon ion implanting the magnetoresistive (MR) ferromagnetic material the magnetoresistive (MR) ferromagnetic material is transformed into a non magnetoresistive (MR) non ferromagnetic material. The enhanced dimensional uniformity of the pair of magnetoresistive (MR) ferromagnetic layers subsequent to their definition by ion implantation derives at least in part from an enhanced dimensional control when ion implanting a layer while employing a mask layer in comparison with etching the layer while employing the mask layer.

Similarly, in contrast with spin valve magnetoresistive (SVMR) sensor elements fabricated employing more conventional methods, as suggested within the references cited within the Description of the Related Art, the teaching from all of which references are incorporated herein fully by reference, which conventional methods yield a spin valve magnetoresistive (SVMR) sensor element with a permanent magnet magnetic biasing layer abutting an edge of the spin valve magnetoresistive (SVMR) sensor element, the method of the present invention provides a spin valve magnetoresistive (SVMR) sensor element with better defined magnetic junctions outside of a sensing region of a spin valve magnetoresistive (SVMR) sensor element, as well as a better defined trackwidth.

EXAMPLES

In order to illustrate the value and operation of the present invention, there was obtained a pair of alumina-titanium carbide substrates employed within magnetoresistive (MR) sensor element fabrication. There was then formed over each substrate a patterned magnetoresistive (MR) ferromagnetic material layer of a nickel-iron (80:20; w/w) permalloy alloy magnetoresistive (MR) ferromagnetic material at a thickness of about 50 angstroms, a length (i.e. long axis or "easy" axis) of about 1.0 microns and a width (i.e. short axis or "hard" axis) of about 0.5 microns.

One of the patterned magnetoresistive (MR) layers was then ion implanted with a dose of chromium implanting ions at an ion implantation dose of about 1E17 ions per square centimeter and an ion implantation energy of about 100 keV. The other patterned magnetoresistive (MR) layer remained non ion implanted.

There was then formed upon each of the patterned magnetoresistive (MR) layers a pair of patterned conductor lead layers formed of a gold conductor lead material formed to a thickness of about 500 angstroms and positioned to define a trackwidth of each of the patterned magnetoresistive (MR) layers of about 1.0 microns.

There was then obtained for each of the patterned magnetoresistive (MR) layers a hysteresis curve obtained by measuring magnetization (in electromagnetic units) as a function of applied extrinsic magnetic field (in oersteds) in directions parallel and anti-parallel the long axis of each of the patterned magnetoresistive (MR) layers.

Figure 6:
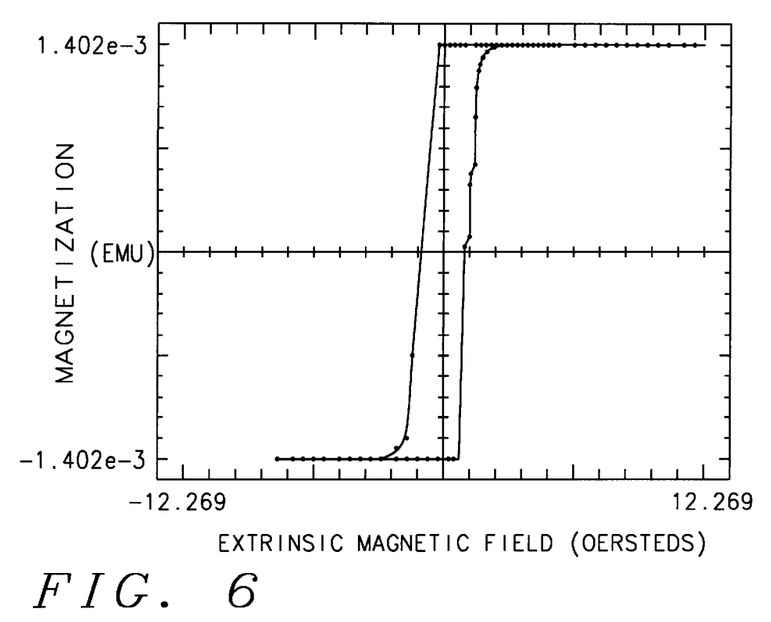
FIG. 6 and FIG. 7 show a pair of hysteresis curves of Magnetization versus Magnetic Field for a non ion implanted magnetoresistive (MR) ferromagnetic material layer and a corresponding ion implanted magnetoresistive (MR) ferromagnetic material layer in accord with the present invention.
Figure 7:
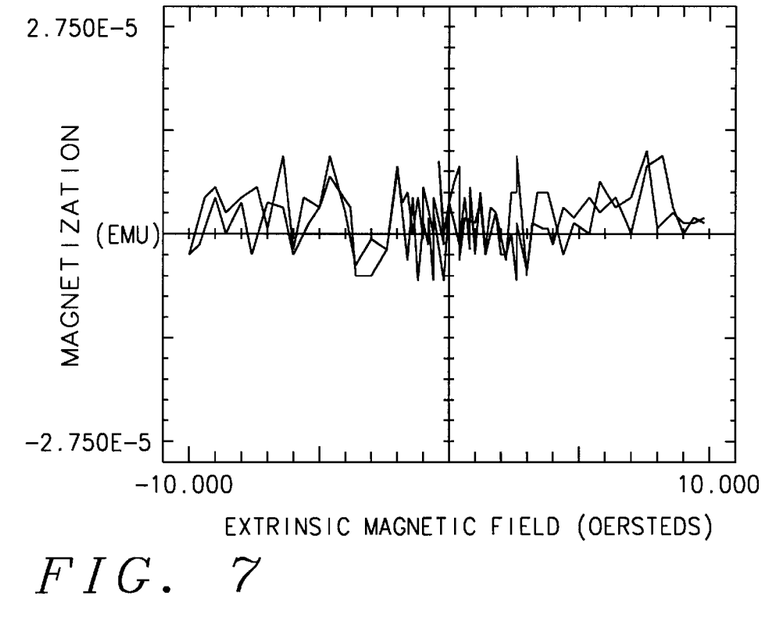

The two hysteresis curves are illustrated in FIG. 6 and FIG. 7, wherein in FIG. 6 there is illustrated the hysteresis curve for the non ion implanted patterned magnetoresistive (MR) layer and within FIG. 7 there is illustrated the hysteresis curve for the ion implanted patterned magnetoresistive (MR) layer. As is seen from review of the data which is illustrated within FIG. 6 in comparison with the data which is illustrated within FIG. 7, there is clearly illustrated within FIG. 7 that the patterned magnetoresistive (MR) layer has been transformed from its original magnetoresistive (MR) ferromagnetic material to a non magnetoresistive non ferromagnetic material.

As is understood by a person skilled in the art, the preferred embodiment and examples of the invention are illustrative of the present invention rather than limiting of the present invention. Revisions and modifications may be made to materials, structures and dimensions through which is provided a magnetic layer or a magnetoresistive (MR) sensor element in accord with the preferred embodiment and examples of the present invention, while still providing embodiments and examples which are within the spirit and scope of the present invention, as defined by the appended claims.

What is claimed is:

1. A method for forming, from an initial magnetoresistive (MR) layer having initial dimensions, a final layer having the same dimensions as said initial layer but containing a final magnetoresistive region of final dimensions which are different from said initial dimensions comprising:

providing a substrate;

forming over said substrate an initial layer of magnetoresistive (MR) material having initial dimensions;

forming over said initial magnetoresistive (MR) layer an ion-implantation mask which is resistant to transmitting ions, the dimensions of said mask being the dimensions of said final magnetoresistive region;

implanting said initial magnetoresistive (MR) layer with ions of a particular species such that said ions penetrate the region of said initial magnetoresistive (MR) layer unprotected by said ion-implantation mask with sufficient energy and dosage to destroy the magnetoresistive properties of said unprotected region while retaining its structural and electrical properties; and forming, thereby, a layer having said initial dimensions, which comprises a final magnetoresistive region of said final dimensions and a contiguous ion-implanted region having no magnetoresistive properties, but upon which contiguous region subsequent material layers can be formed and to which contiguous region electrical connections can be made by said material layers.

2. The method of claim 1 wherein the magnetoresistive (MR) layer is employed within a magnetoresistive (MR) sensor element selected from the group consisting of single stripe magnetoresistive (SSMR) sensor elements, dual stripe magnetoresistive (DSMR) sensor elements, spin valve magnetoresistive (SVMR) sensor elements and dual spin valve magnetoresistive (DSVMR) sensor elements.

3. The method of claim 1 wherein the magnetoresistive (MR) layer is formed of a ferromagnetic magnetoresistive (MR) material selected from the group consisting of nickel-iron alloy ("permalloy") ferromagnetic magnetoresistive (MR) materials, other alloys incorporating permalloy ferromagnetic magnetoresistive (MR) materials, other nickel ferromagnetic magnetoresistive (MR) materials, other iron ferromagnetic magnetoresistive (MR) materials, cobalt ferromagnetic magnetoresistive (MR) materials, alloys thereof and laminates thereof.

4. The method of claim 1 wherein:

the magnetoresistive (MR) layer is formed of a nickel-iron permalloy alloy ferromagnetic magnetoresistive (MR) material; and the dose of implanting ion is a dose of chromium implanting ions.

5. The method of claim 4 wherein the dose of chromium implanting ions is provided at an ion implantation dose and an ion implantation energy sufficient to provide within the ion implanted portion of the magnetoresistive (MR) layer a chromium content of from about 30 to about 50 atom percent.

6. A method for forming a magnetoresistive (MR) sensor element having a magnetoresistive region of final dimensions comprising:

providing a substrate;

forming over the substrate an initial magnetoresistive (MR) layer having initial dimensions; forming over said initial magnetoresistive (MR) layer an ion-implantation mask which is resistant to transmitting ions, the dimensions of said mask being the final dimensions of said magnetoresistive region;

implanting said initial magnetoresistive (MR) layer with ions of a particular species such that said ions penetrate the portion of said initial magnetoresistive (MR) layer not protected by said ion-implantation mask with sufficient energy and dosage to destroy the magnetoresistive properties of said portion while retaining its structural and electrical properties; and forming, thereby, a layer having said initial dimensions, which comprises a magnetoresistive region of said final dimensions and a contiguous ion-implanted region having no magnetoresistive properties, but upon which contiguous region subsequent material layers can be formed and to which contiguous region electrical connections can be made by said material layers; and forming a patterned electrical lead layer over each of the ion-implanted regions of the magnetoresistive (MR) layer, said lead layers being in electrical contact with each of the said ion-implanted regions.

7. The method of claim 6 wherein the magnetoresistive (MR) layer is employed within a magnetoresistive (MR) sensor element selected from the group consisting of single stripe magnetoresistive (SSMR) sensor elements, dual stripe magnetoresistive (DSMR) sensor elements, spin valve magnetoresistive (SVMR) sensor elements anmd dual spin valve magnetoresistive (DSVMR) sensor elements.

8. The method of claim 6 wherein the magnetoresistive (MR) layer is formed of a ferromagnetic magnetoresistive (MR) material selected from the group consisting of nickel-iron alloy ("permalloy") ferromagnetic magnetoresistive (MR) materials, other alloys incorporating permalloy ferromagnetic magnetoresistive (MR) materials, other nickel ferromagnetic magnetoresistive (MR) materials, other iron ferromagnetic magnetoresistive (MR) materials, cobalt ferromagnetic magnetoresistive (MR) materials, alloys thereof and laminates thereof.

9. The method of claim 6 wherein:

the magnetoresistive (MR) layer is formed of a nickel-iron alloy ("permalloy") ferromagnetic magnetoresistive (MR) material; and the dose of implanting ions is a dose of chromium implanting ions.

10. The method of claim 9 wherein the dose of chromium implanting ions is provided at an ion implantation dose and an ion implantation energy sufficient to provide within the ion implanted portion of the magnetoresistive (MR) layer a chromium content of from about 30 to about 50 atom percent.

11. The method of claim 6 wherein a single mask is employed when fabricating the magnetoresistive (MR) sensor element:

first, as an ion implantation mask when ion implanting the magnetoresistive (MR) layer to form ion-implanted regions in two portions of the layer that are laterally disposed to either side of the portion covered by the mask; and second, as a lift off mask when forming the pair of patterned conductor lead layers in electrical contact with the pair of ion implanted portions of the magnetoresistive (MR) layer.

12. The method of claim 6 further comprising forming the magnetoresistive (MR) sensor element into a magnetic data storage enclosure, wherein the magnetic data storage enclosure is selected from the group consisting of linear access storage device (LASD) magnetic data storage enclosures and direct access storage device (DASD) magnetic data storage enclosures.

* * * * *